US008462491B2

(12) United States Patent
Perkins, III et al.

(10) Patent No.: US 8,462,491 B2
(45) Date of Patent: *Jun. 11, 2013

(54) PLATFORM FOR MILITARY RADIO WITH VEHICLE ADAPTER AMPLIFIER

(75) Inventors: Frank N. Perkins, III, Huntsville, AL (US); Jeffrey K. Taylor, Huntsville, AL (US); Lloyd W. Childs, Huntsville, AL (US)

(73) Assignee: Perkins Technical Services, Inc., Huntsville, AL (US)

( * ) Notice: Subject to any disclaimer, the term of this patent is extended or adjusted under 35 U.S.C. 154(b) by 103 days.

This patent is subject to a terminal disclaimer.

(21) Appl. No.: 13/077,568

(22) Filed: Mar. 31, 2011

(65) Prior Publication Data

US 2011/0194250 A1 Aug. 11, 2011

Related U.S. Application Data

(63) Continuation of application No. 12/885,164, filed on Sep. 17, 2010, now abandoned, which is a continuation-in-part of application No. 12/815,555, filed on Jun. 15, 2010, now Pat. No. 8,149,592, which is a continuation-in-part of application No. 12/795,555, filed on Jun. 7, 2010, which is a continuation-in-part of application No. 12/359,947, filed on Jan. 26, 2009, now Pat. No. 8,059,412, which is a continuation-in-part of application No. 11/748,770, filed on May 15, 2007, now Pat. No. 7,733,658, which is a continuation-in-part of application No. 10/895,683, filed on Jul. 21, 2004, now Pat. No. 7,227,755, which is a continuation-in-part of application No. 10/017,411, filed on Dec. 14, 2001, now Pat. No. 6,784,570.

(51) Int. Cl.
*G06F 1/16* (2006.01)

(52) U.S. Cl.
USPC ....... 361/679.02; 307/150; 312/218; 206/534

(58) Field of Classification Search
USPC ............ 307/31, 64, 150; 361/679.02, 679.33, 361/679.43, 679.48, 624, 716, 725, 730, 361/807, 814, 679.55; 312/320, 330.1, 263, 312/215, 265.1, 334.46, 280, 218; 320/107, 320/108; 29/529.1; 206/223, 423, 534; 439/160, 439/352, 449, 331, 607.55, 404

See application file for complete search history.

(56) References Cited

U.S. PATENT DOCUMENTS

| | | | |
|---|---|---|---|
| 7,643,309 B1 * | 1/2010 | Lebo | 361/796 |
| 8,149,592 B2 * | 4/2012 | Perkins et al. | 361/814 |
| 2011/0188212 A1 * | 8/2011 | Hoff et al. | 361/747 |

* cited by examiner

*Primary Examiner* — Hung Duong
(74) *Attorney, Agent, or Firm* — Frank M. Caprio; David E. Mixon; Bradley Arant Boult Cummings LLP

(57) ABSTRACT

A platform for a military radio with a vehicle adapter amplifier has been developed. The apparatus includes a base for supporting at least one SINCGARS RT-1523 radio. The platform has a first power supply that includes a DC power converter for converting 110/220 alternating current into +28 Volt direct current and a second power supply that converts +28 Volt direct current into +6.75 Volts direct current, +13 Volts direct current and +200 Volt direct current. The platform includes a vehicle adapter power amplifier that provides range extension to said SINCGARS RT-1523 radio.

5 Claims, 8 Drawing Sheets

PLATFORM FOR MILITARY RADIO WITH VEHICLE ADAPTER AMPLIFIER

CROSS-REFERENCE TO RELATED APPLICATIONS

This application is a continuation of U.S. patent application Ser. No. 12/885,164 that was filed on Sep. 17, 2010 which is a continuation-in-part of U.S. patent application Ser. No. 12/815,555 that was filed on Jun. 15, 2010 which is a continuation-in-part of U.S. patent application Ser. No. 12/795,555 that was filed on Jun. 7, 2010 which is a continuation-in-part of U.S. patent application Ser. No. 12/359,947 that was filed on Jan. 26, 2009, which is a continuation-in-part of U.S. Pat. No. 7,733,658 that was filed on May 15, 2007, which is a continuation-in-part of U.S. Pat. No. 7,227,755 that was filed on Jul. 21, 2004, which is a continuation-in-part of U.S. Pat. No. 6,784,570 that was filed on Dec. 14, 2001.

FIELD OF THE INVENTION

The present invention relates generally to an integrated power supply and docking platform. In particular, the present invention relates to an integrated power supply and docking platform for a Satellite Communications (SATCOM) radio frequency power amplifier for forming a single physical platform with integrated power electronics.

BACKGROUND ART

The U.S. Department of Defense employs a type of UHF, VHF-FM, and SATCOM combat net radio known as the "Harris 117 Radio". These radios have a military nomenclature of AN/PRC-117. The HARRIS 117 radios, are designed to provide the primary means of tactical communications and control for U.S. ground mounted and dismounted units, all in coordination with naval and air support. HARRIS 117 radios are designed on a modular basis for achieving maximum commonality among the various ground airborne system configurations of the armed forces. HARRIS 117 radios provide U.S. military commanders with a highly reliable, secure, and easily maintainable tactical radio net.

HARRIS 117 radios possess a nominal input power requirement of 24-32 volts direct current, which is supplied by rechargeable on-board batteries. Recharging the HARRIS 117 radio batteries is inconvenient and, in certain mission applications, unattainable. Currently, specialized and complex battery recharging systems are available for recharging HARRIS 117 radio batteries; however, these systems are not always operable in a given application.

SUMMARY OF THE INVENTION

In some aspects, the invention relates to an adapter assembly compromising: a base adapted and arranged for supporting at least one SINCGARS RT-1523 radio; a first connector adapted and arranged for electrically connecting with said SINCGARS RT-1523 radio; a first power supply that includes a DC power converter for converting 110/220 alternating current into +28 Volt direct current; a second power supply that converts +28 Volt direct current into +6.75 Volts direct current, +13 Volts direct current and +200 Volt direct current; and a vehicle adapter power amplifier that provides range extension to said SINCGARS RT-1523 radio.

Other aspects and advantages of the invention will be apparent from the following description and the appended claims.

BRIEF DESCRIPTION OF DRAWINGS

It should be noted that identical features in different drawings are shown with the same reference numeral.

DETAILED DESCRIPTION

Figure 1:
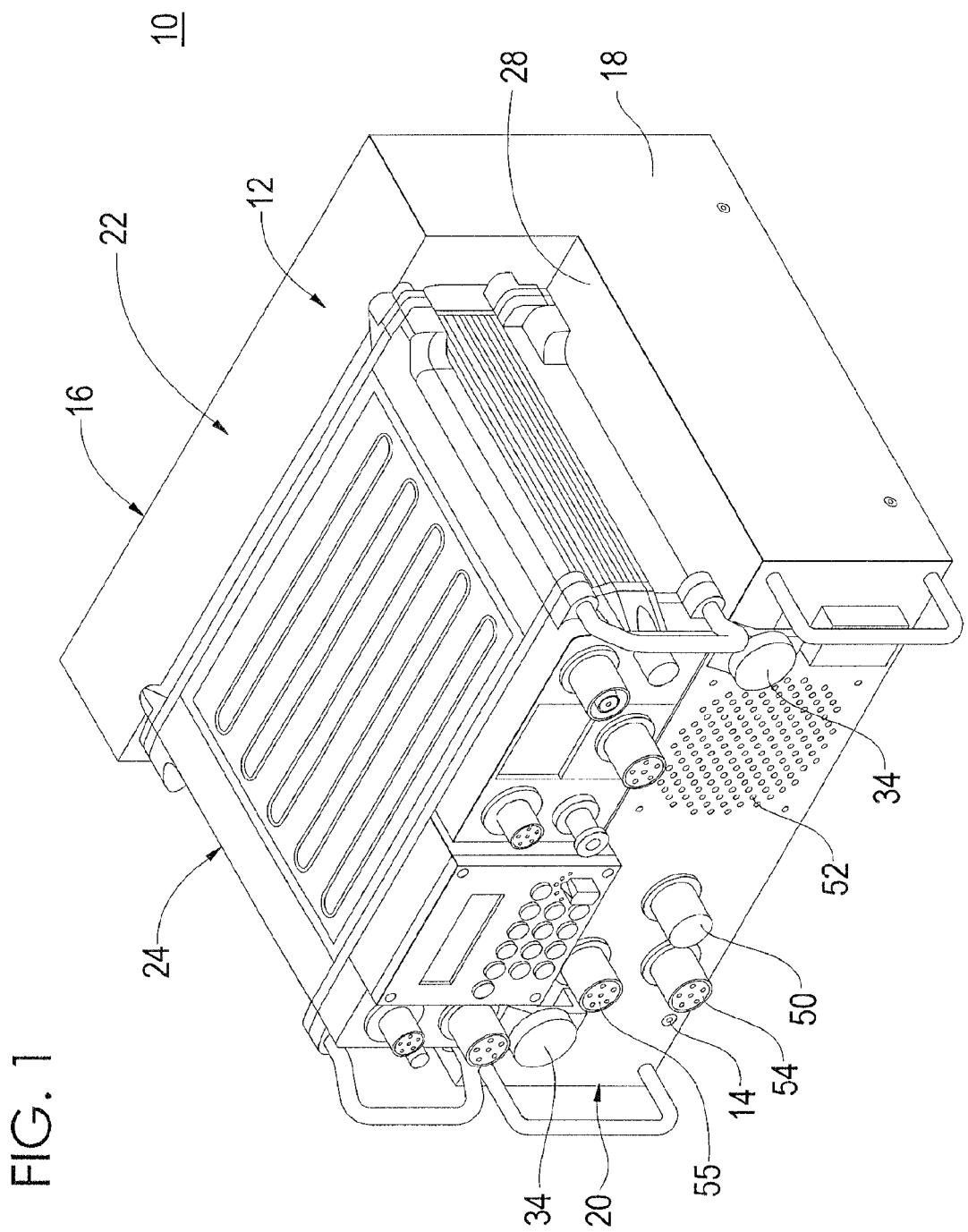
FIG. 1 is a perspective view of one embodiment of the present invention showing a HARRIS 117 radio.
Figure 2:
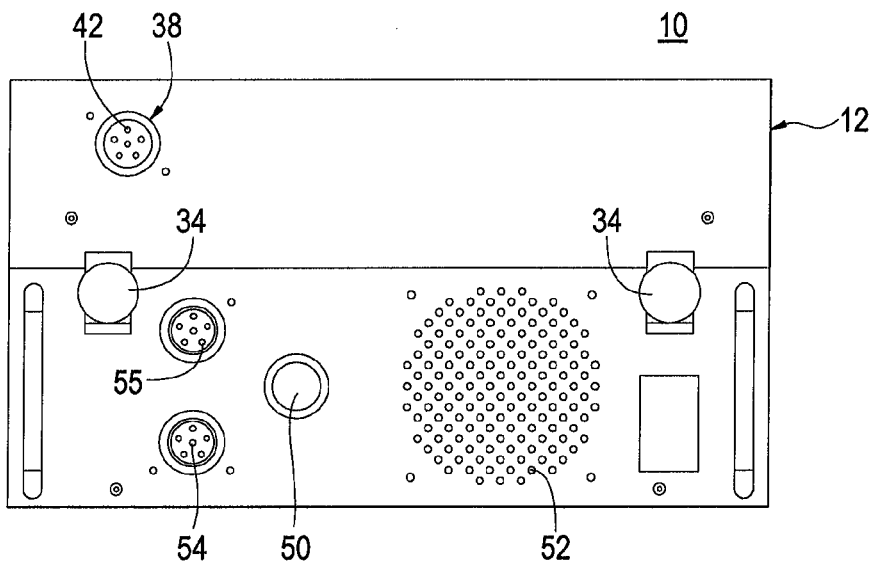
FIG. 2 is a front elevation view of the invention of FIG. 1 without the HARRIS 117 radio.
Figure 3:
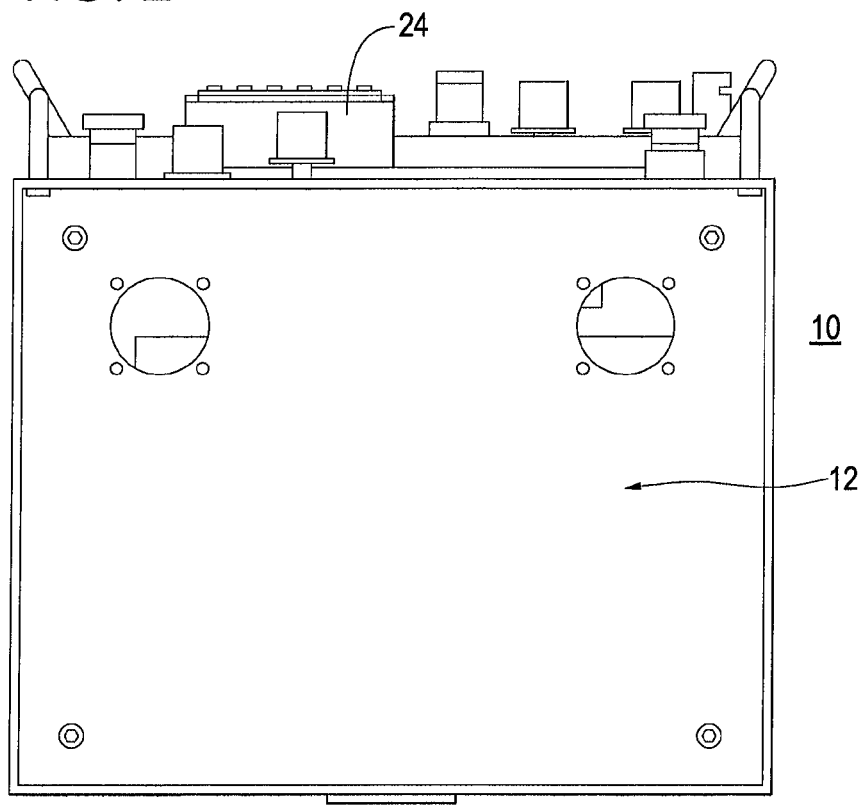
FIG. 3 is a bottom elevation view of the invention of FIG. 1.

An exemplary embodiment of the present invention is illustrated in FIGS. 1-5, where like portions share like numbering. As illustrated at FIGS. 1 through 4, an adapter assembly 10, in accordance with the present embodiment, includes a base 12 having a front side 14, a back side 16, opposing lateral sides 18 and 20 and a top side 22. Top side 22 is adapted to simultaneously support a HARRIS 117 radio 24. To that end, top side 22 includes a substantially flat, horizontal first platform 28 for supporting HARRIS 117 radio.

Extending upward from top side 22 at a 90 degree angle and forming a portion of backside 16 is the support structures for further supporting HARRIS 117 radio 24. More particularly, the support structures include a vertical support clamps 34 extending upward from the platform 28 and having a width corresponding to the width of the platform 28.

A first connector 38 is positioned and arranged so that first connector 38 is in alignment and capable of interfacing with a complementary receptor socket on the rear of HARRIS 117 radio 24, when radio 24 is installed on the platform 28. A suitable connector for use as first electrical connector 38 is 6 pin radio connector type designed and manufactured by Perkins Technical Services, Inc. Receptor contacts 42 are positioned within first connector 38 to receive corresponding male connectors extending within the complementary receptor socket on the rear side of HARRIS 117 radio 24 in accordance with government specifications established for HARRIS 117 radios and HARRIS 117 SATCOM and radio frequency power amplifiers.

2 binding Posts are positioned on the backside to provide direct current take off power for the external power amplifier in accordance with government specifications established for HARRIS 117 radios and HARRIS 117 SATCOM and radio frequency power amplifiers. A third binding post is positioned as a ground drain for external power amplifiers requiring a ground.

A control switch 50 is provided on front side 14 of base 12 for controlling the initiation of power and/or charging for HARRIS 117 radio 24 when installed on adaptor assembly 10. The front side 14 further includes a set of speaker access holes 52 and a microphone adapter 54. The set of speaker access holes 52 allows sound generated by a phone speaker housed within base 12 to exit base 12, while microphone adapters 54, 55 provide a means of connecting the input/output of a HARRIS 117 radio handset to speaker to allow microphone out signals to be transmitted to an audio amplifier circuit and ultimately to speaker.

Opposite front side 14, a standard power plug 58 is supported within back side 16 and is adapted to plug into a standard 110/220 volt household outlet via an electrical cord. The backside also includes a subminature "D" 26 pin connector allowing access to the connector from the backside of the Harris 177 radio 24. Additionally a subminature "D" 9 pin connector to allow the radio to be controlled by TOCNET and a Circular connector to provide the ability of the unit to accommodate a LS/671 SINCGARS External Speaker with Microphone/Handset. Backside 16 further includes a pair of fan access holes 60 to allow a flow of air through base 12 as generated by a pair of fans.

Figure 4:
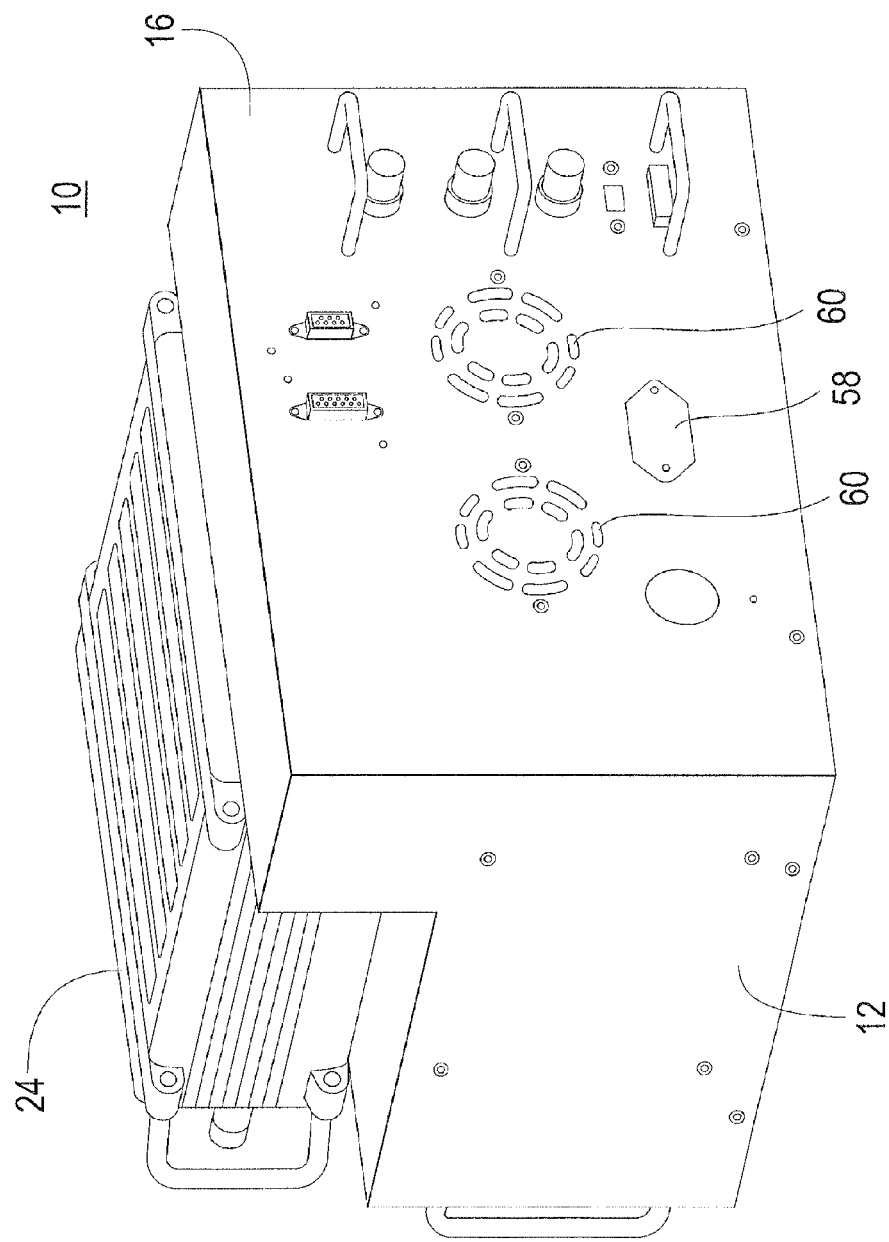
FIG. 4 is a back elevation view of the invention of FIG. 1.
Figure 5:
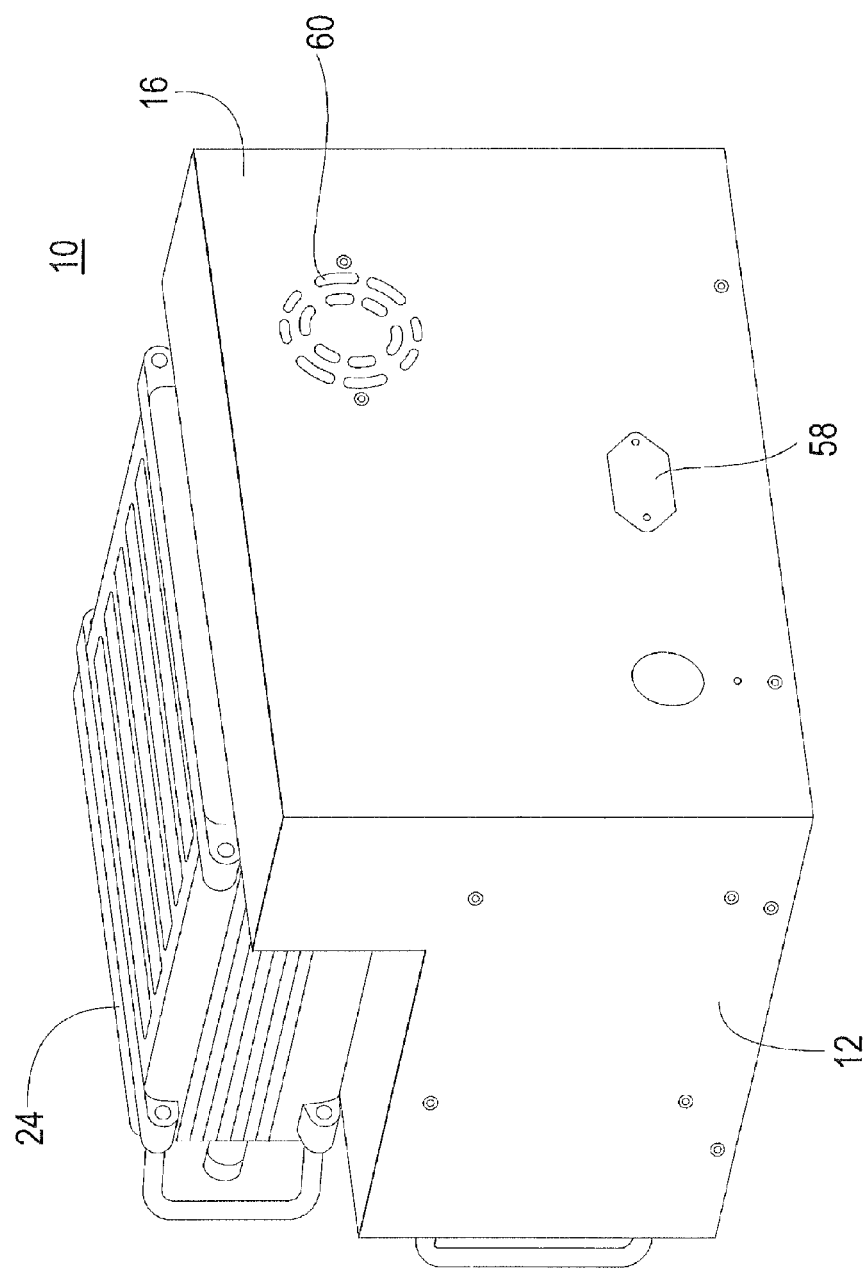
FIG. 5 is a back elevation view of the invention of FIG. 1 with a HARRIS 150 radio.

Referring now to FIGS. 4 and 5, the present embodiment of the invention includes a power supply subsystem for converting standard household 110/220 Volt alternating current into direct current and supplying it to first connector 38 as +24 Volt direct current. When control switch 50 is closed, a power supply converts alternating current power into direct current power at voltage levels required for HARRIS 117 radio 24, i.e., +24 Volt direct current, and outputs the converted power to first connector 38 to allow for powering of HARRIS 117 radio 24 when installed or docked onto adapter assembly 10. A suitable power supply is an ADA600F power supply manufactured by Cosel U.S.A. Inc located in San Jose, Calif.

Audio amplifier circuit is design with a five watt audio amplifier IC LM384N manufactured by National Semiconductor. Audio amplifier circuit acts as a power amplifier and relay for electrical signals generated by the HARRIS 117 radio handset when connected via microphone adapters 54, 55. In this manner, communications exchanged through the handset can be heard via speaker and the volume amplifier circuit provides a power boost of 34 db maximum and operates off the +24 Volt input supply. The output is frequency limited by a low pass output filter. The output level is controlled via 20 k ohm resistor mounted on the front of the unit.

Inasmuch as power supply conversions and power switch wiring are well-known in the electrical arts, further discussion as to the electrical characteristics and properties of the internal power supplies for converting standard 110/220 volt AC into direct current will not be discussed as they are not necessary for a complete understanding of the invention herein described.

An adapter line connects the input/output of the HARRIS 117 radio 24 handset line to the adaptor assembly 10 and internal microphone electronic, and line connects radio handset with the adaptor assembly 10 to allow the transmission of voice communications (i.e. audio signals) to and from the handset. Additional electrical communications also occurs with the HARRIS 117 radio 24 via connectors 38 and 44 The combination of the HARRIS 117 radio 24, and the adaptor 10 allow the HARRIS 117 radio 24 to operate while allowing others in the vicinity of the adaptor unit 10 to hear incoming and outgoing voice transmissions. The LS/671 Speaker connector located on the back of the unit is connected into this circuitry. This allows the LS/671 it broadcast the audio from the handset plugged into the front of the unit as well as the communications received into the radio. The speaker on the front of the base station will also broadcast the audio signals from the Handset plugged into the LS/671 External SINCGARS Speaker.

Figure 6:
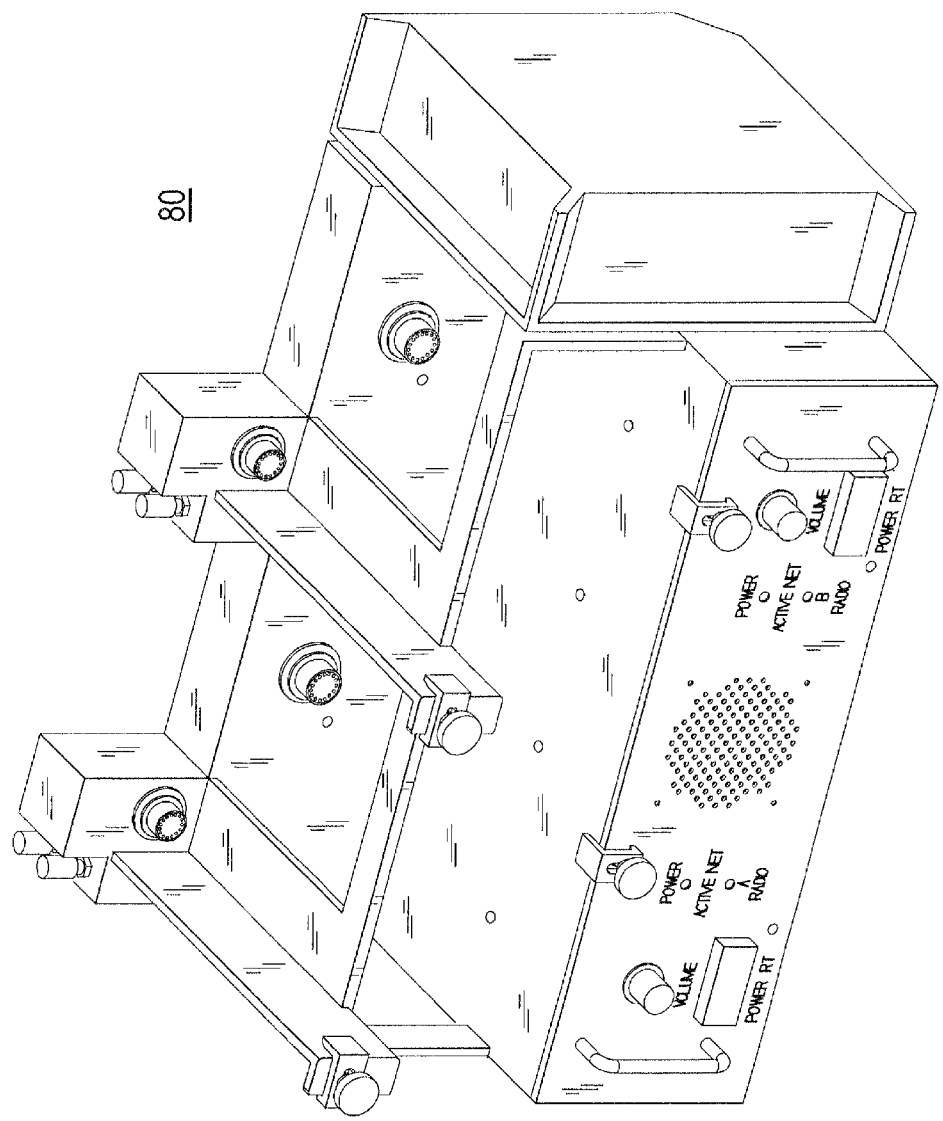
FIG. 6 is a perspective view of another embodiment of the present invention for two SINCGARS RT-1523 model radios.
Figure 7:
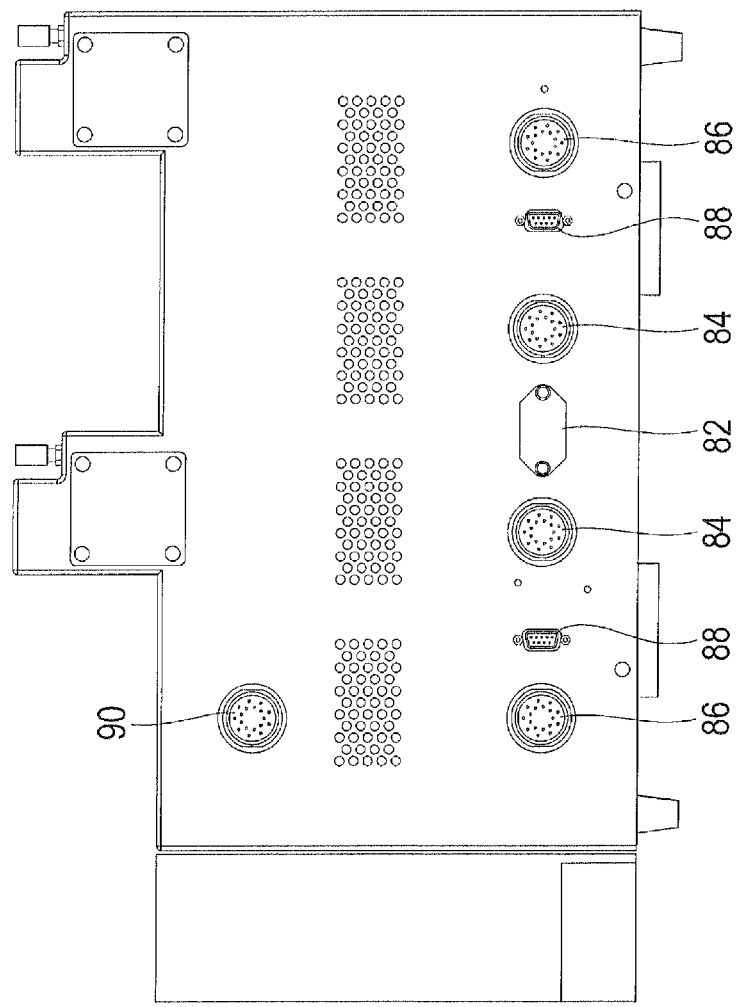
FIG. 7 is a back elevation view of the invention of FIG. 6.

An alternative embodiment of the present invention is shown in FIGS. 6 and 7. This embodiment includes an assembly 80 that includes the ability to switch between AC power and DC power (20 v-30 v) seamlessly and automatically in the powering of tactical radios. This capability allows for the assembly 80 to be connected to both the AC grid and standard tactical batteries currently available throughout the military or to standard military DC vehicle power. Should the AC grid fail the unit automatically will switch over to the DC power without interruption of the power provided to the radio, power amplifiers, external speakers, etc. This switchover is fully automatic and requires no action by the operator.

FIG. 7 shows a rear view of the assembly 80 of this embodiment. The assembly 80 includes an AC Power (85-260 VAC) Connector 82 and two DC Power (18-32 VDC) Connectors 84. The DC Connectors 84 allow for independent batteries (including vehicle batteries) to be attached to maintain radio power. This embodiment also provides two LS/671 speaker connections 86 in addition to two TOCNET control ports 88. This embodiment of the assembly weighs approximately 20 pounds and has size dimensions of 13"×13.5"×17.5". While the embodiment shown is configured to hold up to two SINCGARS RT-1523 model radios, other embodiments could be configured to hold other models of radios including: PRC-117; PRC-150 and PSC-5.

The assembly 80 in this embodiment may also provide a DC power output connector 90 using the standard power connector found in military vehicles. This output connector 90 can provide power for communications accessories such as the ITT Tactical Data Router (TDR) and FCBC2 (Force XXI Battle Command, Brigade and Below) Devices to operate on the assembly's power grid. Additionally, a global positioning system (GPS) unit may be connected (connector not shown) to and powered by the assembly 80.

Figure 8:
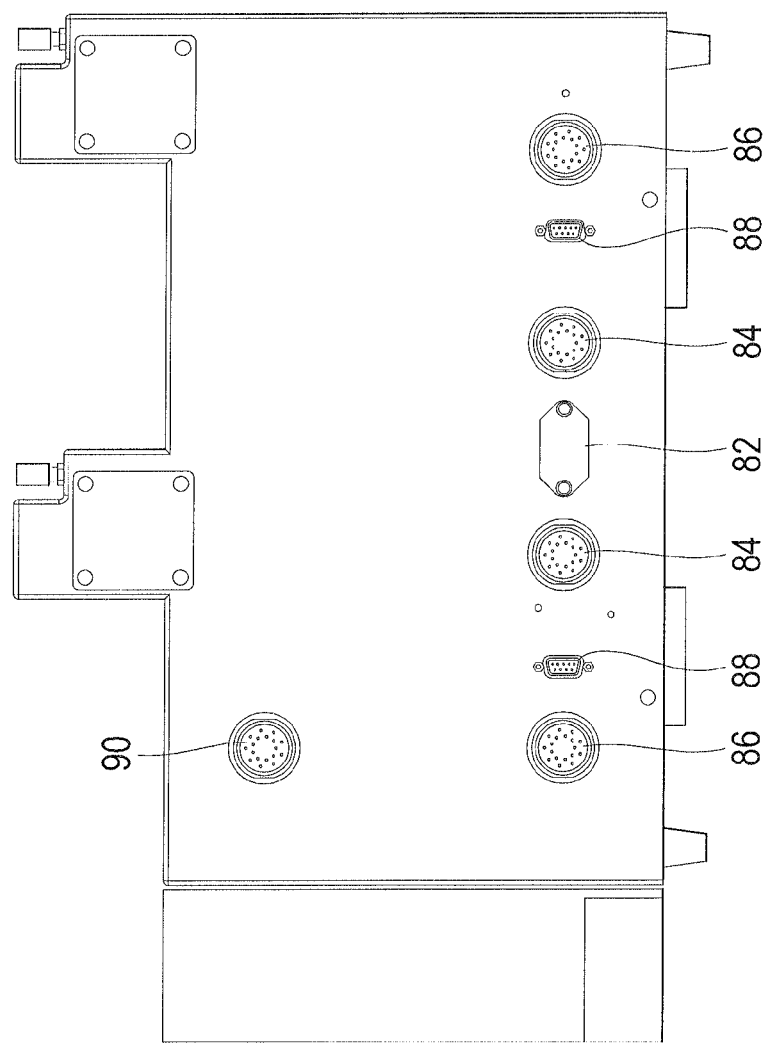
FIG. 8 is a back elevation view of an alternative embodiment of the invention of FIG. 6.

In an alternative embodiment shown in FIG. 8, the assembly 80 is sealed with gaskets from the exterior environment. The seal prevents dust and water from getting into the internal compartments of the assembly 80. In this embodiment, the cooling fans along with their respective vent holes in the rear of the assembly 80 are removed. Instead, the assembly uses internal heat sinks (not shown) to provided cooling for the internal components. Additionally, the entire housing is sealed with gaskets that meet military specification (MIL-SPEC) standards. The gasket seal prevents electromagnetic interference (EMI) discharge.

Another embodiment of the present invention includes a Vehicle Adapter Amplifier ("VAA") provides range extension and allows for rapid radio dismount capability. The SINC-GARS VAA Vehicular Radio Mount AM-7239 is deployed into many vehicles and includes the interface for two SINC-GARS RT-1523 Radios, one Remote Power Amplifier AM-7238 with an electrical connector, and an Internet Controller (INC) which is required for Digital Communications. The electrical connector for the Remote Power Amplifier is adapted and arranged for supplying power from at least two of the power supplies to the Radio Frequency Power Amplifier ("RFPA") AM-7238 and a speaker supported by the base.

Figure 9:
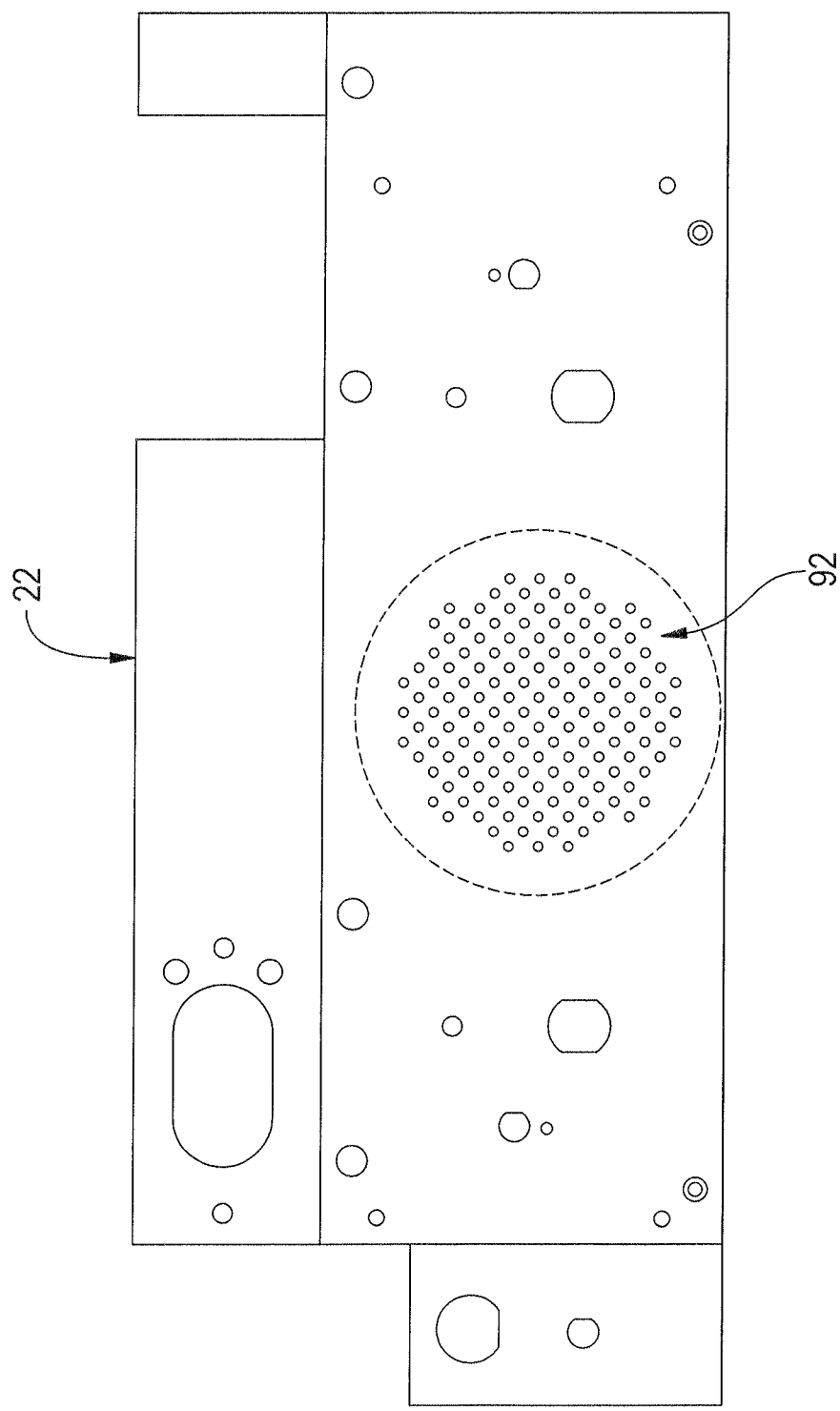
FIG. 9 is a back elevation view of an alternative embodiment of the invention.

In this embodiment shown in FIG. 9, the top side 22 of the mount is adapted to simultaneously support the vehicular radio mount AM-7239 and the radio frequency power amplifier adjacent to one another. A connector is found on the left side of the front of the unit to provide the interface for the Radio Frequency Power Amplifier AM-7238. To that end, top side 22 includes a substantially flat, horizontal first platform for supporting the vehicular radio mount AM-7239 and a lower substantially flat horizontal second platform for supporting RFPA along with a higher, substantially flat, horizontal third platform for supporting a circular connector 92 to provide the ability of the unit to accommodate a LS/671 SINCGARS External Speaker with Microphone/Handset.

The backside of the mount includes an interface connector for digital control of the Radio Frequency Power Amplifier AM-7238 and a 28 VDC power out connector. Backside further includes slot access holes (as shown in FIG. 7) to allow a flow of air through base as generated by a fan mounted in the bottom access panel of the unit.

In this alternative embodiment of the invention, the power supply subsystem converts standard household 110/220 Volt alternating current into direct current and supplies it to first connector as +28 Volt direct current and to second connector as +28 Volt current. When control switch is closed, a first power supply converts alternating current power into direct current power at voltage levels required for SINCGARS RT-1523 radio, i.e., +28 Volt direct current, and outputs the converted power to first connector to allow for powering of SINCGARS VAA Vehicular Radio Mount AM-7239 when installed or docked onto adapter assembly. A suitable power supply for first power supply is a ADA-750 power supply A second power supply is provided for converting direct current power into direct current power for powering RFPA. Thus, when control switch is closed, second power supply converts 28 Volt direct current into +13 Volts direct current, +200 Volts direct current and +6.75 Volts direct current, which is directed to the second connector for powering RFPA. A portion of the +13 Volts direct current is used to supply power to an audio amplifier circuit.

The input/output of the SINCGARS RT-1523 radio voice communications are all accessed through a "Boat" connector. These signals are used to provide the input for the internal speaker, the Active Net LED and the LS-671 connectors on the top of the unit. The LS/671 Speaker connector located on the top of the unit is connected into this circuitry. This allows the LS/671 it broadcast the audio from the handset plugged into the front of the unit as well as the communications received into the radio. The speaker on the front of the base station will also broadcast the audio signals from the Handset plugged into the LS/671 External SINCGARS Speaker. Under normal radio operations the LS/671 External Speaker requires the Radio to be placed in a remote mode for operations. As this unit is primarily for fixed site operations where the external speaker is used to monitor radio communications in a commander's office this interface does not require the radio to be placed in Remote operation mode but allows the handset to be operated at the radio and the LS/671 Speaker and Handset. This embodiment also includes two light emitting diodes which indicates when a given radio is active to enable the radio operator to identify which radio is in operation when multiple radios are installed in one location.

The placement of the power amplifier minimizes the overall footprint of the unit while staggering the placement of the second power supply to promote cooling of the power amplifier mounted in the VAA by insuring the exposure of the power amplifier's cooling fins to the air.

While the invention is shown in one form, it will be obvious to those skilled in the art that it is not so limited but is susceptible of various changes and modifications without departing from the spirit thereof. For example, various plug placements on the rear member of the invention as well as to accommodate upgrades and modifications to the current HARRIS 117 radios used by the Armed Forces. Moreover, the height of the rear member and orientation of the electrical plug on the rear of the invention could easily be varied to accommodate different types of radio configurations. These include the HARRIS 150 class of radios as well as other variations and versions of the radios and communications equipment. In general, it is physical dimensions to meet various types of HARRIS 117 radio configurations exist, such as those in existing model numbers: Ground ICOM radios using receiver-transmitter. These models are fully intended to be used and are compatible with embodiments of the present invention.

What is claimed is:

1. An adapter assembly compromising:
   a. a base adapted and arranged for supporting at least one SINCGARS RT-1523 radio;
   b. a first connector adapted and arranged for electrically connecting with said SINCGARS RT-1523 radio;
   c. a first power supply that includes a DC power converter for converting 110/220 alternating current into +28 Volt direct current;
   d. a second power supply that converts +28 Volt direct current into +6.75 Volts direct current, +13 Volts direct current and +200 Volt direct current; and
   e. a vehicle adapter power amplifier that provides range extension to said SINCGARS RT-1523 radio.

2. The assembly according to claim 1, further comprising two light emitting diodes which indicates when a given radio is active to enable the radio operator to identify which radio is in operation when multiple radios are installed in one location.

3. The assembly according to claim 1, further comprising and external SINCGARS Speaker LS/671 connected with said SINCGARS RT-1523 radio.

4. The assembly according to claim 3, further comprising an audio amplifier circuit in electrical connection with the and external SINCGARS Speaker LS/671.

5. The assembly according to claim 1, where the placement of the power amplifier minimizes the overall footprint of the assembly while staggering the placement of the second power supply to promote cooling of the power amplifier mounted in the vehicle adapter power amplifier by insuring the exposure of the power amplifier's cooling fins to cooling air.

* * * * *